US007111190B2

(12) United States Patent
Venkatraman et al.

(10) Patent No.: US 7,111,190 B2
(45) Date of Patent: Sep. 19, 2006

(54) METHOD AND APPARATUS FOR RECONFIGURABLE MEMORY

(75) Inventors: Siva Venkatraman, San Jose, CA (US); Earle F. Philhower, III, Union City, CA (US); Ruban Kanapathippillai, Dublin, CA (US); Manoj Mehta, Laguna Hill, CA (US)

(73) Assignee: Intel Corporation, Santa Clara, CA (US)

( * ) Notice: Subject to any disclaimer, the term of this patent is extended or adjusted under 35 U.S.C. 154(b) by 708 days.

(21) Appl. No.: 10/056,393

(22) Filed: Jan. 24, 2002

(65) Prior Publication Data

US 2002/0120826 A1 Aug. 29, 2002

Related U.S. Application Data

(60) Provisional application No. 60/271,139, filed on Feb. 23, 2001.

(51) Int. Cl.
*G06F 11/00* (2006.01)

(52) U.S. Cl. .................................. 714/6; 714/5; 714/8

(58) Field of Classification Search .................... 714/8, 714/5, 6, 7; 369/53.17; 711/152, 203
See application file for complete search history.

(56) References Cited

U.S. PATENT DOCUMENTS 3,735,368 A * 5/1973 Beausoleil .................. 365/200
3,803,560 A * 4/1974 DeVoy et al. .................. 714/5
4,922,451 A * 5/1990 Lo et al. ......................... 714/8
5,146,571 A * 9/1992 Logan ........................... 714/8
5,293,593 A * 3/1994 Hodge et al. ............... 711/202
5,848,021 A * 12/1998 Sugibayashi ........... 365/230.06
5,937,435 A * 8/1999 Dobbek et al. ............. 711/202
5,995,731 A * 11/1999 Crouch et al. ................ 716/4
6,141,768 A * 10/2000 Lin et al. ........................ 714/8
6,212,647 B1 * 4/2001 Sims et al. .................... 714/8
6,295,595 B1 * 9/2001 Wildenberg et al. ........ 711/211
6,400,602 B1 * 6/2002 Takata et al. .......... 365/185.09
2001/0042223 A1 * 11/2001 Hoskins ......................... 714/8

* cited by examiner

*Primary Examiner*—Nadeem Iqbal
*Assistant Examiner*—Timothy M. Bonura
(74) *Attorney, Agent, or Firm*—Molly A. McCall

(57) ABSTRACT

A reconfigurable memory in an integrated circuit includes an array of memory cells and a memory controller. The array of memory cells in the reconfigurable memory are tested to determine if they are unusable and if so, their associated physical addresses corresponding to their physical location. After determining the physical addresses where any failure exists, the physical addresses locations associated with the physical locations of unusable memory cells or memory blocks are mapped out to avoid addressing them. While mapping out unusable memory locations or memory blocks reduces the total capacity, the reconfigurable memory has sufficient capacity for the integrated circuit to remain functionally usable.

23 Claims, 7 Drawing Sheets

METHOD AND APPARATUS FOR RECONFIGURABLE MEMORY

CROSS REFERENCE TO RELATED APPLICATIONS

This non-provisional U.S. patent application claims the benefit of U.S. Provisional Application No. 60/271,139 filed on Feb. 23, 2001 by inventors Siva Venkatraman et al entitled "METHOD AND APPARATUS FOR RECONFIGURABLE MEMORY".

FIELD OF THE INVENTION

The invention relates generally to the field of memory. Particularly, the invention relates to reconfigurable memory.

BACKGROUND OF THE INVENTION

As integrated circuit devices have become more complex, their die sizes have increased even though transistor sizes have been decreasing. This is so because of the increased demand for performance, functionality and integration into today's integrated circuits. To accommodate the increased die sizes of integrated circuits, the actual sizes of wafers used in semiconductor manufacturing of integrated circuits has been increasing as well to manufacture a reasonable number of the large die sizes simultaneously. It is not uncommon to talk about integrated circuits being one inch by one inch and manufactured on a wafer having a diameter of twelve inches or more. While wafer sizes have increased, they have not kept up with the demand for die size increases of integrated circuits. As a result, the number of dies of an integrated circuit on one wafer (die per wafer) has been decreasing. Thus, the yield of each individual die of the integrated circuit across a wafer is important in order to lower costs and obtain higher profit margins. Yield is even more important when memory circuitry having memory cells is included. The memory cells tend to be more sensitive to certain types of defects in semiconductor manufacturing because of their dense transistor circuitry.

Memory integrated circuits, such as random access memory (RAM) integrated circuits and read only memory (ROM) integrated circuits, typically have a rated capacity such as thirty two megabytes or sixty-four megabytes. The entire rated capacity needs to be functional in order to sell the memory integrated circuit. Thus, manufacturers of memory integrated circuits usually provide redundant rows and/or redundant columns of memory cells to substitute in for a bad row or bad column of memory cells.

Bad rows or bad columns in a memory integrated circuit are typically discovered during wafer testing prior to packaging the memory integrated circuit. In this case, fuses or links in the memory integrated circuit can be cut by a laser to substitute in a redundant row or a redundant column of memory devices for a respective bad row or bad column.

Other types of integrated circuits which are not a memory integrated circuit may include some memory circuitry therein. Typically if any part of the memory circuitry therein was tested to be defective, the entire integrated circuit was marked as being defective and discarded.

Today some integrated circuits, including micro-processor integrated circuits, micro-computer integrated circuits, application specific integrated circuits, custom integrated circuits, digital signal processing integrated circuits, and application specific signal processing integrated circuits, commonly have large blocks of memory circuitry therein such as one to sixteen megabytes or more of memory. Because the memory circuitry has become much larger in these integrated circuits, it can cause a higher rate of failure.

BRIEF DESCRIPTION OF THE DRAWINGS

Like reference numbers and designations in the drawings indicate like elements providing similar functionality.

DETAILED DESCRIPTION OF THE INVENTION

In the following detailed description of the invention, numerous specific details are set forth in order to provide a thorough understanding of the invention. However, the invention may be practiced without these specific details. In other instances well known methods, procedures, components, and circuits have not been described in detail so as not to unnecessarily obscure aspects of the invention.

A reconfigurable memory in an integrated circuit includes memory cells and a memory controller. To support the reconfigurable memory, memory cells are tested to determine if there is a failure in the cell or a failure in accessing the cell during a read or write operation. After determining where any failure exists, the address locations associated with the physical locations of unusable memory cells or memory blocks are mapped out to avoid addressing them. Memory blocks may also be referred to as memory banks. This allows the logical addressing to work around the unusable memory cells or memory blocks. While mapping out unusable memory locations or memory blocks reduces the total capacity, the reconfigurable memory has sufficient capacity for the integrated circuit to remain functionally usable at a reduced functional percentage.

Figure 1:
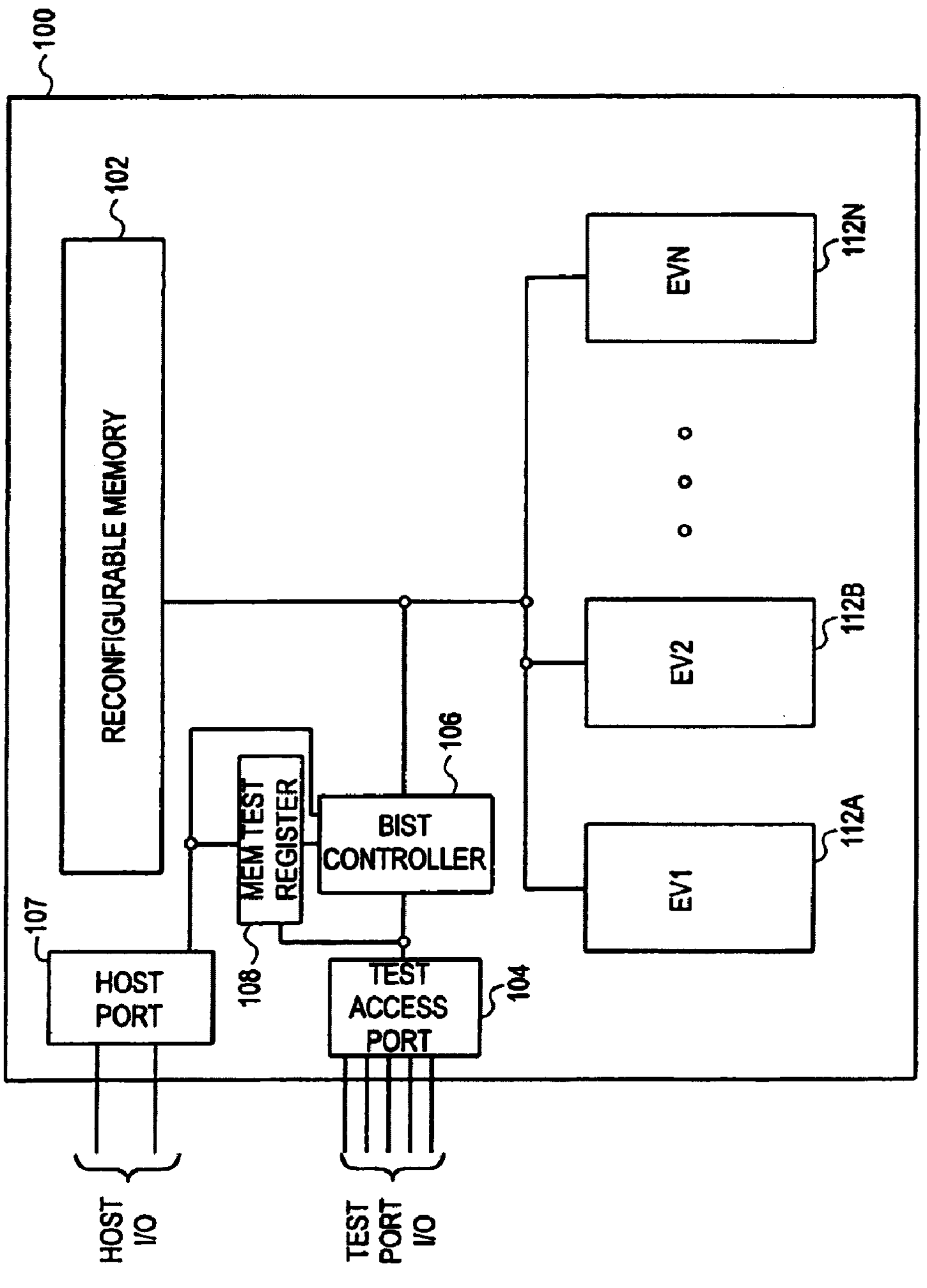
FIG. 1 is a block diagram of an integrated circuit including an embodiment of the reconfigurable memory of the invention.

Referring now to FIG. 1, an integrated circuit 100 including a reconfigurable memory 102 is illustrated. The reconfigurable memory 102 is reconfigurable in that it can map out bad or unusable memory cells. Memory blocks of the reconfigurable memory 102 having a bad memory cell therein can be mapped out so that they are not addressed. To further support the reconfigurable memory 102, the integrated circuit 100 includes a test access port (TAP) 104, a built in self-tester (BIST) 106, a host port 107, and a memory test register 108. The reconfigurable memory 102 in one embodiment is a global memory such that data and code of programs can be shared by one or more execution units EU1 112A through EUN 112N. The integrated circuit in one embodiment is application specific signal processor and the one or more execution units EU1 112A through EUN 112N are digital signal processing units to process one or more communication channels.

The built-in-self-tester 106 within the integrated circuit 100 in one embodiment is a memory tester to test each and every memory block and memory cell of the reconfigurable memory 102 in order to determine or detect which memory blocks and memory cells are bad. After testing the reconfigurable memory 102, the unusable or bad memory cells and memory blocks can be mapped out by reprogramming the relationship between the logical address space and the physical address space. The BIST 106 is a hardware BIST and includes one or more controllers, a state machine, a comparator, and other control logic. The one or more controllers controls the testing of memory blocks 212 in the reconfigurable memory 102. To speed testing, the one or more controllers operate in parallel each testing a one or more memory blocks at a time. This reduces testing time and testing costs and the time for realignment of the logical addresses by a system. It is preferable to not test all memory blocks at the same time in order to avoid peak power consumption. In one embodiment, three controllers are provided each to test six memory blocks in a reconfigurable memory having eighteen memory blocks. The state machine under an algorithm is used to generate the addresses and the data of a test pattern to test the reconfigurable memory 102. The comparator within the BIST 106 performs a comparison between the actual test results and the expected test results to determine if a memory block or memory cell within the reconfigurable memory passed or failed a test.

The test access port 104 is a Joint Test Action Group (JTAG) serial test port in one embodiment. Testing of the reconfigurable memory 102 can be initiated externally through the test access port 104, the host port 107 or another access port that can communicate with the built-in-self-tester 106 and the test register 108. In the case that the test access port 104 is a JTAG test port, testing can be initiated externally by data communication over the input and/or output pins of the test access port 104. In the case that the host port 107 is used to initiate testing of the reconfigurable memory, the data communication to initiate the testing is performed externally in parallel over parallel input and/or output pins of the host port 107. To initiate and perform testing of the reconfigurable memory, the host port 107 couples to the memory test register 108 and the BIST 106. To initiate and perform testing of the reconfigurable memory, the test access port 104 couples to the memory test register 108 and the BIST 106. The testing can be kicked off externally by a host controller by writing to the memory test register 108 and setting a BIST start indicator 508 (shown in FIG. 5) of the register 108. Alternatively, it can be kicked off through the test access port 104.

The reconfigurable memory 102 is sized accordingly (i.e., it has a maximum capacity) such that reductions in memory capacity can still provide a functional device. For example, the reconfigurable memory 102 may have eight (8) megabits of maximum memory capacity configured as sixteen (16) blocks of five-hundred-twelve (512) kilobits. If one or more memory cells in one memory block goes bad, it can be mapped out reducing the total memory capacity. In the case of the example where a whole memory block is mapped out, the total memory capacity is reduced by five-hundred-twelve (512) kilobits. If additional blocks of memory are mapped out, the total memory capacity is reduced in additional increments of five-hundred-twelve (512) kilobits. A minimum capacity of the reconfigurable memory 102 may be a single block of memory such that the integrated circuit 100 can remain functional. In the exemplary reconfigurable memory 102, one memory block is five-hundred-twelve (512) kilobits of memory capacity.

The total memory capacity of the reconfigurable memory 102 can be binned out during testing at the factory similar to frequency binning of integrated circuits, such as microprocessors. For example with a maximum total capacity of eight (8) megabits, the reconfigurable memory can be binned out in increments of five-hundred-twelve (512) kilobits according to the total usable memory space therein. That is, the integrated circuit 100 having the reconfigurable memory 102 may be binned out into bins of 8 meg, 7.5 meg, 7 meg, 6.5 meg, 6 meg, 5.5 meg, 5 meg, 4.5 meg, 4 meg and so on and so forth. Other bin sizes and increments of mapping out memory capacity can be used.

Similar to price points for various frequency bins, price points can be established for various levels of memory capacity of the reconfigurable memory 102. The price of the integrated circuit 100 can be adjusted at each bin for the reduction in capacity of the reconfigurable memory 102. The price points can be established because of different device yields which is inversely proportional to the device manufacturing costs.

The binning of the integrated circuit 100 for different memory capacities of the reconfigurable memory allows for increased die yield over a silicon wafer. For example, assume that only 10% of the die on a wafer test out to have a reconfigurable memory 102 with a maximum capacity. Assuming the reconfigurable memory 102 is binned out at 7 megabits of capacity and has five-hundred-twelve kilobit (512 k bit) memory blocks, by allowing two memory blocks each of 512 k bits to be defective, the yield of die per wafer can increase to approximately 25% for example. A greater percentage yield can be achieved for the integrated circuit 100 using lower memory capacity binning for the reconfigurable memory 102. Thus, manufacturing costs and price can be reduced for an integrated circuit 100 including a reconfigurable memory 102 when binning is used.

In the case that the executions units EU1 112A–EUN 112N are digital signal processing units and the reconfigurable memory 102 is a global memory supporting a number of communication channels, the reduction in total memory capacity reduces the number of communication channels supported. With binning of the memory capacity of the reconfigurable memory and the respective channel capacity, the price and cost of manufacture of the integrated circuit 100 can be reduced.

Figure 2:
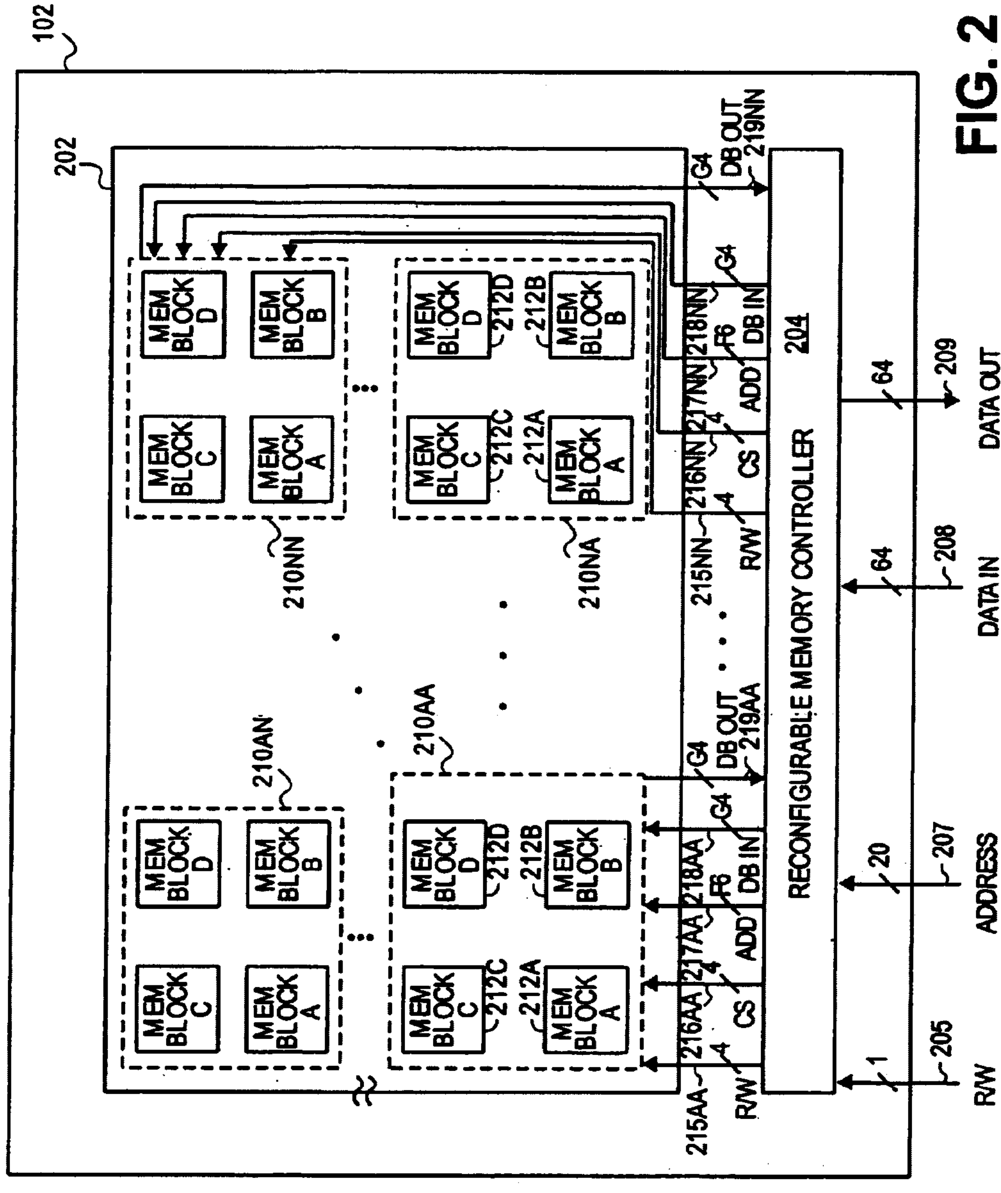
FIG. 2 is a block diagram of an embodiment of the reconfigurable memory of the invention.

Referring now to FIG. 2, a block diagram of the reconfigurable memory 102 is illustrated. The reconfigurable memory 102 includes a memory array 202 and a reconfigurable memory controller 204. The memory array 202 is organized into one or more clusters 210AA–210NN. The one or more clusters 210AA–210NN are generally referred to as clusters 210. Each cluster 210 includes a memory block A 212A, a memory block B 212B, a memory block C 212C, and a memory block D 212D generally referred to as memory block 212. Each of the memory blocks 212 is in and of itself a memory unit including row and column address decoders, sense amplifiers, and tri-state drivers. The sense amplifiers are used to determine the data stored into memory cells which are addressed by row and column address decoders during a read operation. The tri-state drivers can be used to drive data into the memory cells addressed by row and column address decoders during a memory write operation. Each cluster 210 in the memory array 202 includes four memory blocks 212 and signals for each. These signals received by each cluster 210 are generally four read/write strobes R/W 215 and four chip select signals CS 216, one for each memory block; and an address bus ADD 217, a data bus input DB IN 218, and a data bus output DB OUT 219 for each memory block. Each instance of these signals for each cluster includes a two letter extension on its reference number associated with the respective cluster as illustrated in FIG. 2. For example, cluster 210AA receives four read/write strobes R/W 215AA, four chip select signals CS 216AA, one for each memory block; an address bus ADD 217AA, a data bus input DB IN 218AA, and a data bus output DB OUT 219AA. In one embodiment, each address bus ADD 217 is sixteen bits wide to address sixty-four (64 k) kilo-words in each memory block using eight (8) bit words, and each data bus input DB IN 218 and data bus output DB OUT 219 is sixty-four bits wide. Each of the memory blocks 212A–212D in each cluster 210 receives one of the R/W strobes 215 and one of the chip select signals CS 216. Each of the memory blocks 212A–212D in each cluster 210 couple to its respective address bus ADD 217, data bus input 218 and data bus output 219 for each respective cluster. The chip select signals CS 216 represent a decoding of the upper address bits of the address bus 207 while the signals on each respective address bus ADD 217 for each memory block are a function of the lower address bits of the address bus 207.

The reconfigurable memory controller 204 receives a read/write strobe R/W 205, an address bus 207, a data input bus 208 and a data output bus 209. Reconfigurable memory controller 204 receives the read/write strobe R/W 205 and the address bus 207 to address the memory blocks and clusters in the memory array 202 by generating the appropriate signals on each cluster's four read/write strobes R/W 215, four chip select signals CS 216, and address bus ADD 217.

The reconfigurable memory controller 204 also maps out the addresses of bad memory cells and bad memory blocks and then re-align the logical addressing to the physical addressing so as to achieve a continuous logical address map. For example, if during testing it is determined that the memory block B 212B in FIG. 2 has a bad memory cell, it is mapped out from the address space by the reconfigurable memory controller 204. The reconfigurable memory controller 204 transparently maps out addresses such that the address space remains linearly configured from an address of zero to the usable capacity of the memory array 202. After selectively configuring the reconfigurable memory controller 204, a user or programmer can write to or read from the reconfigurable memory in a contiguous manner. In the case that the memory block B 212B having the failure is mapped out, the maximum logical address of the address space, representing the usable capacity that is addressable in the memory array 202, is reduced from the maximum physical address.

The reconfigurable memory controller 204 includes configuration registers which can be externally programmed in order to realign the logical addressing and map out bad memory blocks. The registers in one embodiment are externally programmed when the reconfigurable memory 102 is embedded within a system. Upon initialization, the reconfigurable memory 102 is tested and the initialization software programs the configuration registers to map out and realign the logical addressing. In another embodiment, the configuration registers are non-volatile or have a fuse-link type of programmability and can be programmed at the factory. In this case, the integrated circuit is tested in wafer or packaged form at the factory and the configuration registers are programmed as well accordingly. In either embodiment, the testing and reconfiguration of the reconfigurable memory can be transparent to the system designer and user of the printed circuit board incorporating the integrated circuit 102. The testing of the reconfigurable memory 102 can be done by the integrated circuit itself by using the BIST when in a system. Alternatively, the reconfigurable memory 102 can be externally tested by production test software through the pins of a packaged integrated circuit or the pads of a die of the integrated circuit in wafer form.

Figure 3:
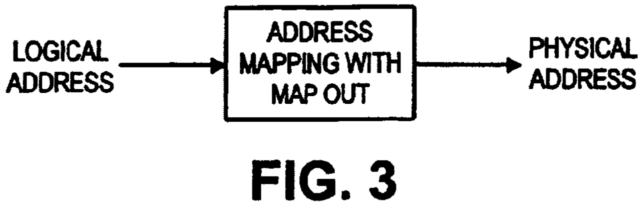
FIG. 3 is a functional block diagram of the address mapping provided by the reconfigurable memory controller of the invention.

Referring now to FIG. 3, the basic addressing functionality of the reconfigurable memory controller 204 is illustrated. Reconfigurable memory controller 204 receives a logical address and generates a physical address output which is coupled into the memory array 202. The reconfigurable memory controller 204 further maps out addresses of bad memory blocks and bad memory cells and includes the configuration registers to realign the logical address map. In programming, the logical address map can be flexibly realigned including a realignment into a continuous linear address range.

Figure 4:
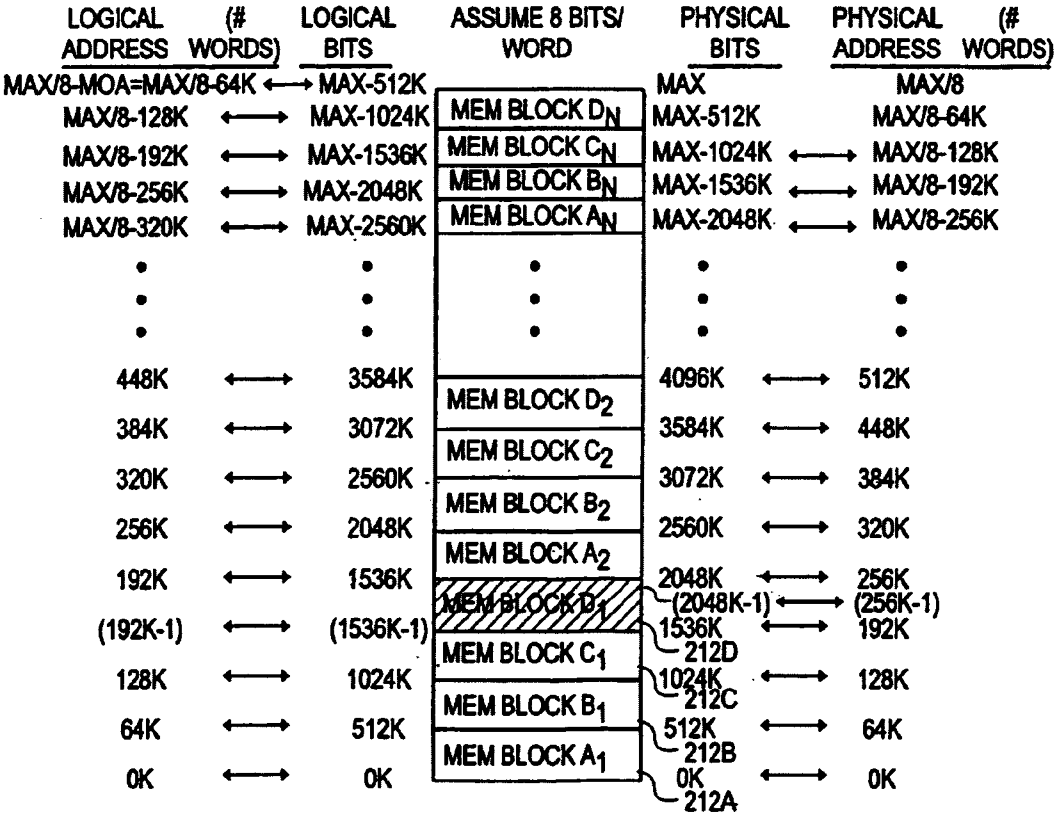
FIG. 4 is an exemplary diagram illustrating mapping out memory locations and the relationship of logical and physical addressing of address space in the reconfigurable memory of the invention.

Referring now to FIG. 4, an exemplary address space of a reconfigurable memory illustrating how address mapping of logical addresses into physical addresses with mapping out of addresses of bad memory blocks and bad memory cells is provided. Each memory block is assumed to access eight (8) bits with each address. If each memory block has five-hundred twelve (512 k) kilo-bits, then each memory block will have sixty-four (64 k) kilo-words of address space with each word being 8 bits wide. In the example of FIG. 4, the memory block D1 can correspond to memory block D 212D of the memory cluster 210AA and has an unusable memory cell. It is desirable to reconfigure the reconfigurable memory 102 so that the memory block D1 is mapped out and a linear logical address space is maintained. In FIG. 4, the logical addresses and the logical bit sequence accessed by the logical addresses of the reconfigurable memory are on the left. The physical addresses and the physical bit sequence accessed thereby of the reconfigurable memory are on the right. The physical address space varies from a zero k-word address (0 k) to a maximal address (MAX/8 word) corresponding to the maximum capacity (MAX bits) of the reconfigurable memory 102. The logical address space varies from a zero k-word address (0 k) to the maximum addressable range less the number of mapped out addresses (MAX/8-MOA).

In the example of FIG. 4, a single memory block D1 212D having a physical bit sequence from 1536 k-bit to (2048 k−1)-bit is mapped out due to a bad memory cell. In this case, the logical address and the physical address for logical bit sequence from 0 k-bit to (1536 k−1)-bit in memory blocks A1 212A, B1 212B, and C1 212C are equal. Thereafter the logical address and physical address are not equal. In order to map out the single memory block D1 212D, the logical address for logical bit sequence from 1536 k-bit to (MAX-512 K)-bit is shifted by 512 k bits to obtain the physical address. For example, the logical address (192 k-word) for logical bit 1536 k is mapped to the physical address (256 k-word) for physical bit 2048 k. In this manner, the software can see a continuous contiguous memory space even though a block of memory has been removed.

Figure 5:
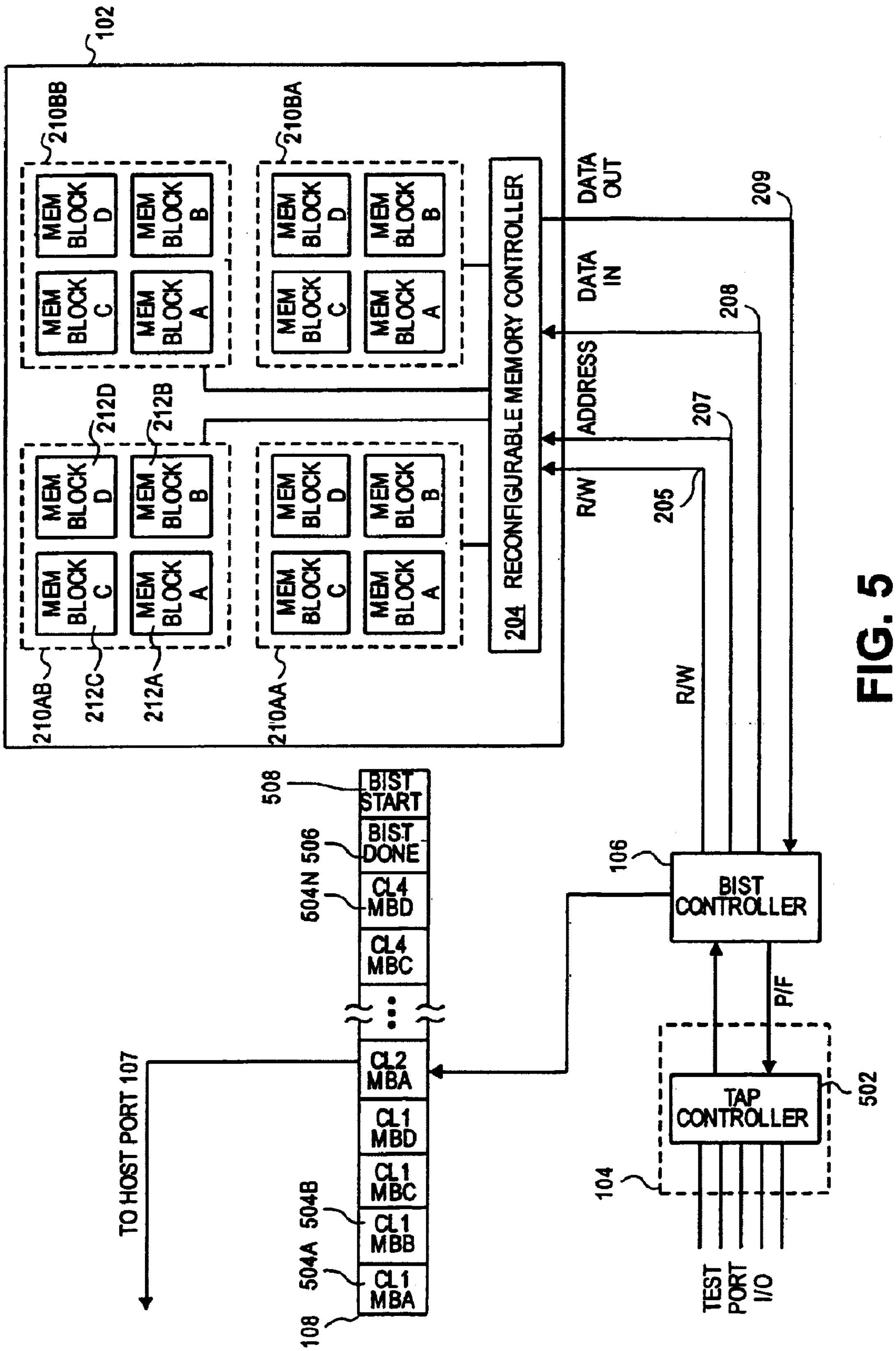
FIG. 5 is a block diagram of an embodiment of the reconfigurable memory of the invention and functional blocks used to test the reconfigurable memory.

Referring now to FIG. 5, an exemplary reconfigurable memory 102', the test access port 104, the BIST controller 106, and the memory test register 108 are illustrated. The reconfigurable memory 102' has four clusters, cluster 210AA, cluster 210AB, cluster 210BA, and cluster 210BB. Each of the memory clusters 210 includes memory block A, memory block B, memory block C, and memory block D. The reconfigurable memory 102' in one embodiment is organized into sixteen (16) memory blocks each having five-hundred-twelve (512) kilobits, containing a maximum capacity of eight (8) megabits. The reconfigurable memory 102' further includes the reconfigurable memory controller 204.

The serial test access port 104 includes a TAP controller 502 coupled to the BIST controller 106. The memory test register 108 includes a pass/fail indicator 504A–504N for each memory block of each cluster within the reconfigurable memory 102'. The pass/fail indicators 504A–504N are labeled in FIG. 5 as CL1 MBA 504A for cluster 1, memory block A through CL4 MBD 504N for cluster 4, memory block D. The memory test register 108 further includes a BIST (built-in self tester) done indicator 506 and a BIST start indicator 508. The BIST done indicator 506 is generally a flag to indicate that the built-in self test of the reconfigurable memory 102' has been completed or not. The BIST start indicator 508 is used to kick off the memory test. Each pass/fail indicator 504A–504N within the memory test register 108 is set to indicate whether the corresponding memory block has passed or failed testing. In one embodiment, each of the pass/failed indicators 504A–504N, the BIST done indicator 506, and the BIST start indicator 508 is represented using a 1-bit value.

In order to test the reconfigurable memory 102', the BIST controller 106 generates test signals. Test signals generated by the BIST controller 106 strobe the Read/Write signal line 205, signal addresses on the address bus 207, and writes test data on the data input bus 208. The BIST controller 106 further reads out data from memory locations within the reconfigurable memory array 102' over the data output bus 209. The BIST controller 106 compares expected data output from the reconfigurable memory with the actual data output on the data output bus 209. The expected data output is predetermined from the type of memory test and the respective test signals which are provided to the reconfigurable memory. One or more known memory tests, such as a March test, can be used in testing the reconfigurable memory.

The BIST controller 106 sets the pass/fail indicators 504A–504N within the memory test register 108 indicating either a pass or fail for each respective memory block based on the comparison between expected data output and the actual data output. The BIST controller 106 further indicates to the TAP controller 502 whether a memory block has passed or failed testing so that it can be externally signaled out through the serial test access port 104 as well. Upon completion of the testing of the reconfigurable memory, the BIST controller 106 sets the BIST done indicator 506 indicating that testing is completed.

The memory test register 108 is externally accessible by a host system through the host port 107. The access to the memory test register 108 can be I/O mapped or memory mapped within the integrated circuit 100. As further explained herein, a host system also has access to the reconfigurable memory controller 204 through the host port 107 to set registers therein for controlling the mapping out of memory blocks having bad memory cells. After completion of testing, the host system may desire to set registers within the reconfigurable memory controller 204 to control addressing of the reconfigurable memory 102.

Figure 6:
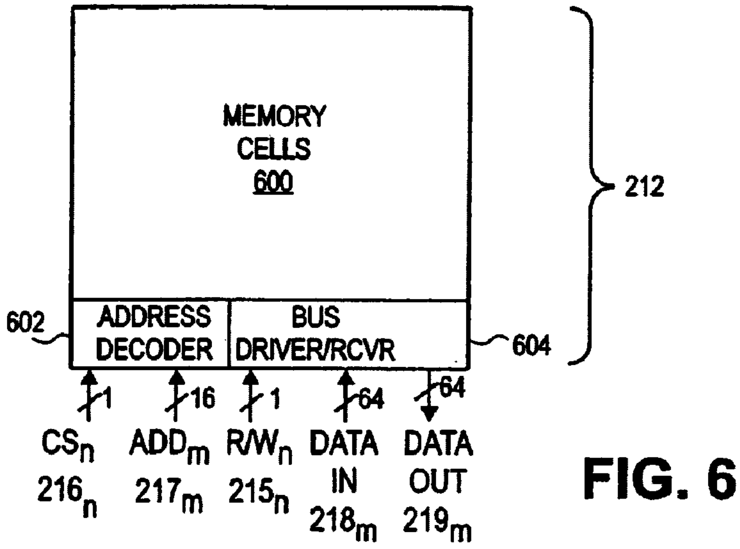
FIG. 6 is block diagram of an exemplary memory block for an embodiment of the reconfigurable memory of the invention.

Referring now to FIG. 6, an instance of a memory block 212 is illustrated. Each memory block 212 includes an array of memory cells 600, an address decoder 602 and a bus driver/receiver 604. A word of memory cells can be accessed within the array of memory cells 600 of the memory block 212. Each word of memory within the memory block 212 is W bits wide. In one embodiment, a word is 64-bit wide and can be obtained in one access.

There are "N" memory blocks 212 within the reconfigurable memory 102 while there are "M" clusters 210. The use of "n" and "m" with a reference number represents an instance of each. Each memory block 212 in a cluster 210 receives a chip select signal CS 216*n* of the chip select signals CS 216 and a read/write strobe R/W 215*n* of the read write strobes R/W 215. Each memory block 212 in a cluster 210 further couples to the address bus 217*m*, the data in bus 218*m* and the data out bus 219*m* for the respective cluster. That is, there are N chip select signals CS 216 and N read/write strobes R/W 215 respectively one for each CS 216*n* and one for each R/W 215*n*. There are M address buses 217, M data in buses 218, and M data out buses 219 respectively one for each address bus 217*m*, data in bus 218*m* and data out bus 219*m*.

The array of memory cells 600 in the memory block 212 are organized into columns and rows. The address decoder 602 can include a row address decoder and a column address decoder in order to access the memory cells and read or write data therein. The bus driver/receiver 604 includes a sense amplifier array and latches in order to read data out from memory cells selected by the address decoders and store it into the latches. The bus driver/receiver 604 further includes a driver to drive data which is stored in the latches onto the data bus 219. Another set of latches can also store data off of the data in bus 218*m* that is to be written into the memory block 212.

Each chips select signal CS 216*n* is an enable or activate signal that enables access to each respective memory block 212 and is derived from the upper bits of the address bus 217*n*. The lower bits of the address bus 217*n* further addresses a word or words within the array of memory cells 600 in the enabled memory block 212 of a respective memory cluster 210. The read/write strobe R/W 215*n* indicates whether data on the data in bus 218*m* is to be written into the memory block 212 or if data is to be read out from the memory cells 600 onto the data out bus 219*m*.

Figure 7:
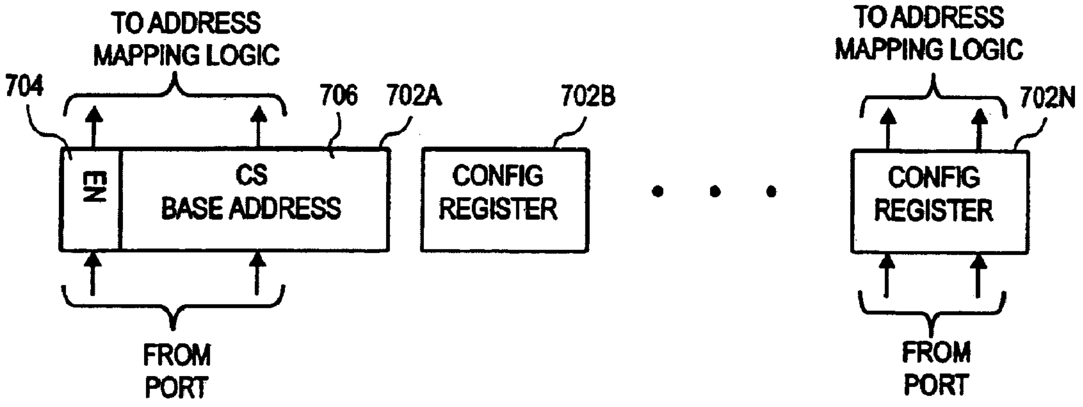
FIG. 7 is a block diagram of configuration registers for the reconfigurable memory controller of FIGS. 2 and 5.

Referring now to FIG. 7, the reconfigurable memory controller 204 includes an array of configuration registers 702A–702N. Each configuration register 702A–702N includes an enable bit 704 and a chip select base address 706 and is associated with a respective memory block 212 in the reconfigurable memory 102. The chip select base address 706 allows the addressing for a memory block 212 to be selectively offset in order to start addressing the memory block at a different address. This allows blocks with bad memory cells to be worked around. The value of the chip select base address 706 can be anything and need not be limited to establish a linear address space. A non-linear address space can be utilized for some reason. It should be noted that the chip set base address 706 can also be referred to as a memory block base address.

Each configuration register 702A–702N can be loaded in parallel through the host port 107. The information stored within the enable bit 704 in each configuration register 702A–702N, is utilized by the address mapping logic within the reconfigurable memory controller to map out unusable blocks or unusable memory cells. The information stored within the chip select base address 706 in each configuration register 702A–702N can be used to provide a continuous linear memory space of logical addressing. Alternatively, the information stored within the chip select base address 706 in each configuration register 702A–704N can be used to provide a non-linear memory space of logical addressing. The configuration registers 702A14 702N are usually loaded after the reconfigurable memory 102 has been tested. During reset of the integrated circuit, such as during power on reset, the enable bit 704 in each configuration register is set so as to enable access to each memory block 212 for testing. The information stored within the chip select base address 706 of each configuration register is defaulted to provide access and test each memory cell within the reconfigurable memory 102 during reset of the integrated circuit. In one embodiment, the default information stored in the chip select base address 706 of each configuration register provides linear logical addressing and a one to one mapping to physical addressing. The linear logical addressing is provided at default by setting the value of the chip select base addresses 706 to start at zero for configuration register 702A and increment thereon for each of the configuration registers 702B to 702N. In any case, the default information should allow the total capacity of the reconfigurable memory 102 to be tested in order to determine which memory cells and memory blocks are unusable.

To reprogram the reconfigurable memory 102, software executing on an external host controller or within the integrated circuit 100 can read the pass/fail information within the test register 108 and set/clear the enable bit 704 and the values of the chip select base address 706 in each configuration register 702 accordingly for each memory block 212. The values of the chip select base address 706, the most significant address bits, set by the external host controller can linearize the logical addressing by setting a linear sequence of 0, 1, 2, 3 and so on, incrementing by one. Alternatively, a different logical addressing scheme can be utilized by prograimning the values of the chip select base address 706 differently.

Figure 8:
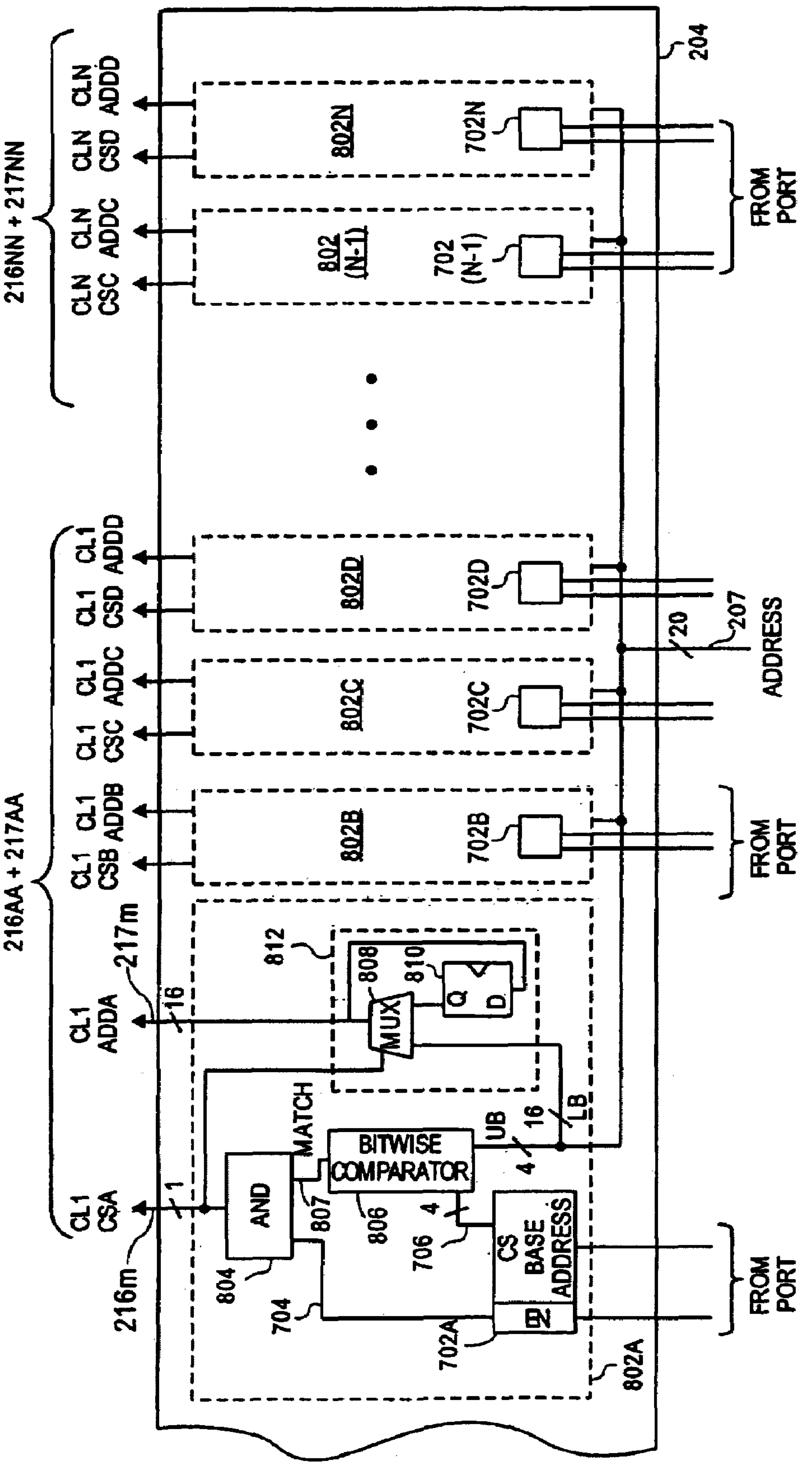
FIG. 8 is a detailed block diagram of address mapping logic within the reconfigurable memory controller of FIGS. 2 and 5.

Referring now to FIG. 8, a detailed block diagram of the reconfigurable memory controller 204 is illustrated for addressing each of the memory blocks within the reconfigurable memory 102. For N memory blocks 212, the reconfigurable memory controller 204 includes N address mappers 802A–802N, generally each instance is referred to as address mapper 802. The N address mappers 802A–802N generate each chip select signal 216*n* and address 217*n* respectively for each memory block. The bits of the address bus 207 are split into upper bits and lower bits of the address bus 207 within each address mapper 802. The upper bits of the address bus 207 are used to generate the chip select or enable for each block of memory while the lower bits of the address bus 207 are used to generate the address for the memory locations within a memory block 212 selected by the chip select.

Each of the N address mappers 802A–802N include a respective configuration register 702A–702N as illustrated. The enable bit 704 of each configuration register 702 is coupled into an AND gate 804. Each of the chip select base addresses 706 of each of the configuration registers 702 is coupled into a bit wise comparator 806.

Each enable bit 704 in each configuration register 702 controls whether or not the respective memory block 212 is to be mapped out or not. If the enable bit 704 is set, the respective memory block 212 is not mapped out. If the enable bit 704 is not set, the respective memory block 212 is mapped out. The enable bit 704 gates the generation of the chip select signal 216*n*. If the enable bit 704 is set, the chip select signal 216*n* can be generated through the AND gate 804 if the upper addresses match the chip select base address. In this case, the respective memory block 212 is not mapped out. If the enable bit 704 is not set, the chip select signal 216*n* can not be generated through the AND gate 804 regardless of any address value and the respective memory block 212 is mapped out.

The upper bits of the address data bus 207 are coupled into the bit wise comparator 806 to be compared with the chip select base address 706. First, the bit wise comparator 806 essentially takes a logical exclusive NOR (XNOR) of each respective bit of the upper bits of the address data bus 207 and the chip select base address 706. The comparator then logically ANDs together each of the XNOR results of this initial bit comparison to determine if all the upper bits of the address data bus 207 match all the bits of the chip select base address 706 to generate a match output 807. If there is any difference in the bits, the match output 807 is not generated and the respective memory block 212 is not enabled. The match output 807 of the bit wise comparator 806 is coupled into the AND gate 804. The output of the AND gate 804 in each of the address mappers 802A–802N is the respective chip select signal 216*n* for each memory block 212 in each cluster 210.

The lower bits of the address bus 207 are coupled into a bus multiplexer (MUX) 808 in each of the address mappers 802A–802N. Each of the address mappers 802A–802N further includes a register 810 to store a change in a bus state of each respective address bus 217*n*. The bus multiplexer 808 and the register 810 form a bus state keeper 812 in each address mapper 802.

In each address mapper 802, the multiplexer 808 and register 810 are coupled together as shown in address mapper 802A. The output from each respective register 810 is coupled into an input of each respective bus MUX 808 in the address mappers 802A–802N. The other bus input into the bus multiplexer 808 is the lower bits of the address bus 207. The chip select signal 216*n* for each respective address mapper 802 controls the selection made by each respective bus MUX 808. In the case that the respective memory block 212 is to be addressed as signaled by the chip select signal CS 216*n,* then a new address is selected from the lower bits of the address bus 207. In the case that the respective memory block 212 is not to be addressed, then the state of the respective address bus 217 previously stored within the register 801 is selected to be output from the MUX 808 by the chip selected signal CS 216*n*. In this manner, the multiplexer 808 and register 810 recycle the same lower bits of address until the respective memory block 212 is selected for access by the upper bits of the address bus 207. Keeping the state of the bus 216 from changing, conserves power by avoiding a charging and discharging the capacitance of the address bus 217*n* until necessary. The operation of each bus state keeper 812 is similar to that of the bus state keepers 902 further described below with reference to FIG. 9. The multiplexer 808 in each of the address mappers is typically controlled by the chip select signals to demultiplex the address bus 207 into one of the address buses 217.

Figure 9:
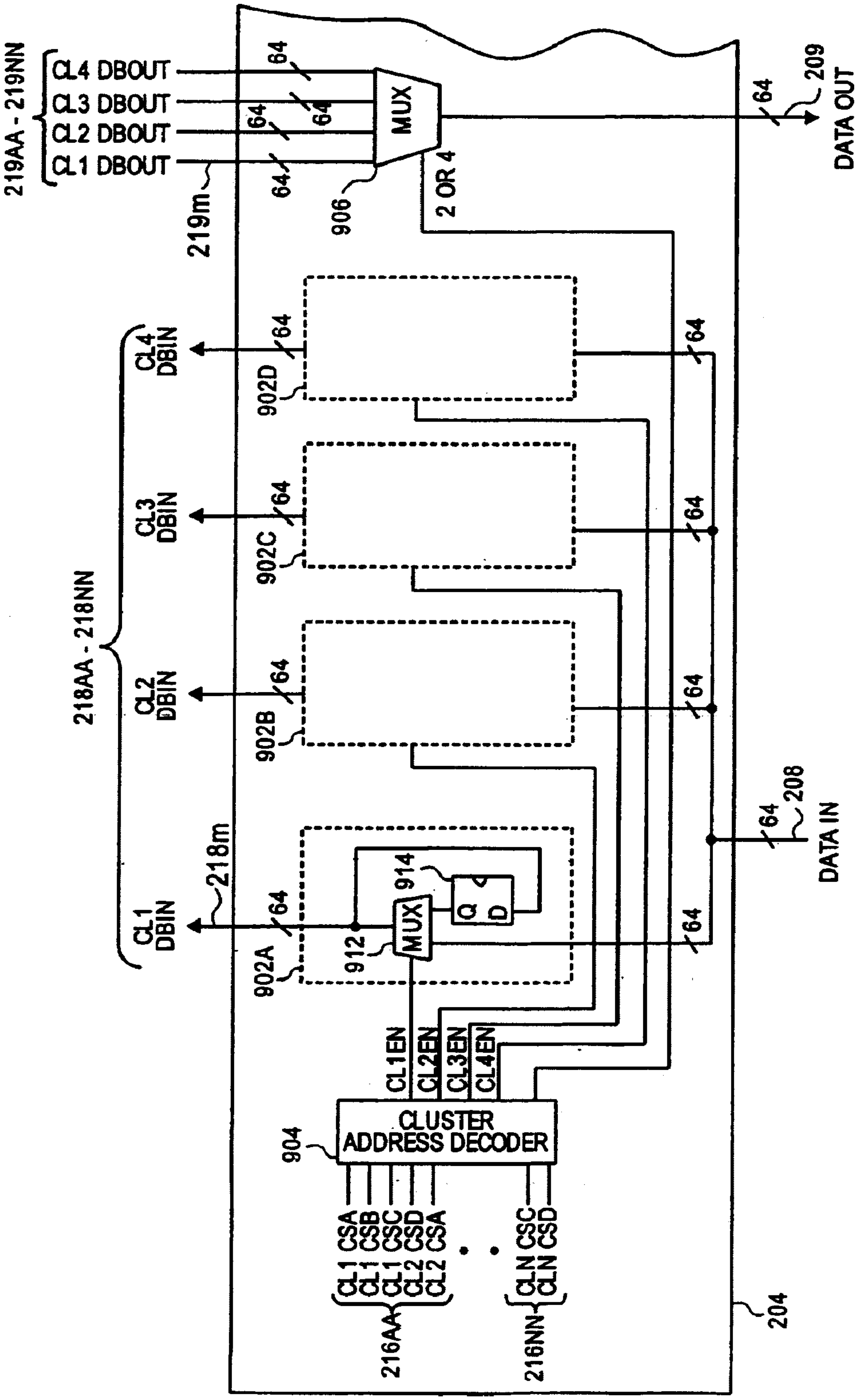
FIG. 9 is a detailed block diagram of data read and write logic within the reconfigurable memory controller of FIGS. 2 and 5.

Referring now to FIG. 9, a block diagram of the data input/output control provided by the reconfigurable memory control 204 for the reconfigurable memory 102 is illustrated. The reconfigurable memory controller 204 receives the data bus input 208 and provides the data bus output 209 for the reconfigurable memory 102. The reconfigurable memory controller 204 couples to the data input buses 218 and data output buses 219 of each memory cluster 212 to write and read data there between.

The reconfigurable memory controller 204 includes a bus state keeper 902 for each cluster 212 labeled bus state keepers 902A–902D, a cluster address decoder 904, and a bus multiplexer 906. The bus multiplexer 906 receives as input each of the data out buses 219AA–219NN of each cluster 212 in the reconfigurable memory. It is controlled by a cluster selection control signal from the cluster address decoder 904. The output of the bus multiplexer 906 couples to and generates signals on the data output bus 209 of the reconfigurable memory 102. The embodiment of the bus multiplexer 906 corresponding to exemplary embodiment of FIG. 9 is a four-to-one bus multiplexer and receives as input each of the data out buses 219AA–219BB of each cluster 212. In FIG. 9, the data out buses for the four cluster embodiment of FIG. 5 are CL1 DBout 219AA, CL2 DBout 219AB, CL3 DBout 219BA and CL4 DBout 219BB.

Each of the bus state keepers 902 includes a two-to-one bus multiplexer 912 and a register 914 coupled together as shown by bus state keeper 902A in FIG. 9. The data input bus 208 is coupled into one bus input of each bus multiplexer 912 and the output of each respective register 914 is coupled into the other bus input of each respective bus multiplexer 912. Each respective register 914 stores the state of each bit of the respective data input bus 218 when it changes state. The register 914 keeps the stored state on the bus 218 until the state of the respective bus 218 is to be updated. The state of a respective bus 218 is updated or changed when the bus multiplexer 912 is controlled to select the data bus input 208 as its output onto the bus 218. Otherwise, with the bus multiplexer 912 selecting the output of the register 914 as its output, the state on the bus 218 is recirculated when the register 914 is clocked. In one embodiment, a system clock can be used to clock the register 914.

The cluster address decoder 904 receives all of the chip select signals 216 for each memory block 212 of each cluster 210 and controls each bus multiplexer 912 in the bus state keepers 902 and the bus multiplexer 906. The chip select signals 216 are responsive to the upper bits of the address bus and the chip select base address 706 of a respective configuration register. In response to a selected chip select signal 216 of a respective memory block, the cluster address decoder 904 enables data to flow into and out of the respective cluster where the respective memory block resides. In effect, the cluster address decoder 904 logically ORs the chip select signals 216 for memory blocks within each cluster together. If any memory block is selected within the cluster, the data paths into and out of that cluster through the reconfigurable memory controller 204 are enabled. The cluster address decoder 904 selectively controls the bus multiplexers 912 of the bus state keepers 902 to select the data input bus 208 as its output onto data bus 218 in response to the chip select signals 216. The cluster address decoder 904 logically controls the bus multiplexers 912 in all the bus state keepers 902 as a bus demultiplexer. That is, the data input bus 208 is selected for output on one of the buses 218 in response to signals from the cluster address decoder 904.

For example, assume that the upper address bits and the chip select base address generates cluster 2 chip select A to enable access to memory block A in cluster 2. The cluster address decoder 904 generates a cluster 2 enable signal CL2EN which is coupled into the bus multiplexer 912 of the bus state keeper 902B. This controls the bus multiplexer 912 in the bus state keeper 902B to allow the information on the data input bus 208 to be transmitted to the cluster 2 bus data bus input CL2DBIN 218AB.

Because the chip select base address 706 is programmable in each configuration register 702, a memory block can be rearranged to be addressed with a different cluster of memory blocks. That is, the memory blocks 212 can be addressed across cluster boundaries due to the programmability of the chip select base address 706 and the bus multiplexers 912 in the bus state keepers 902 and the bus multiplexer 906 for the data input and output busses. This allows adaptive control of the addressing of the memory blocks within the reconfigurable memory to achieve any desirable logical address space.

The bus multiplexer 906 multiplexes the data output buses 219 from each cluster 210 into the data output bus 209 of the reconfigurable memory 102. Each bus 219 of the clusters 210 is coupled to an input of the bus multiplexer 906. The output of the bus multiplexer 906 is coupled to the data output bus 209 to generate data signals thereon. Control signals from the cluster address decoder 904 are coupled into the selection input of the bus multiplexer 906 to select which cluster data bus output 219 is multiplexed onto the data bus output 209 through the reconfigurable memory controller 204. The control signals from the address decoder 904 can be the same or function similar to the cluster enable signals CL1LEN through CL4EN or they may be different in that they are for a read operation as opposed to a write operation. The control signals may also be encoded to control the bus multiplexer 906. The control signals select the active cluster where a word of memory in a memory block therein was accessed. For example assume that a word of memory in memory block A of cluster 3 was accessed by the address during a read operation. The control signals from the cluster address decoder 904 set up the bus multiplexer 906 to select the cluster 3 data bus output as its output onto the data output bus 209. In this manner the data read out from a selected memory block in a selected cluster is read out onto the data output bus 209 or the reconfigurable memory.

Avoiding changes of state in buses can conserve considerable power when the buses have significant capacitive loading. This is particularly true when there are many buses which have capacitive loading or a bus is wide having a high number of bit or signal lines. In the reconfigurable memory 102' for example, there are four input data buses 218, four output data buses 219, four address buses 217, sixteen chip select lines 216, and sixteen read/write strobes 215 between the reconfigurable memory controller 204 and all the memory blocks 212 of the memory array 202. Each of the data buses 218 and 219 have sixty-four signal lines and each of the address buses 217 have sixteen signal lines in the reconfigurable memory 102'. The length of the input data buses 218, output data buses 219, address buses 217, chip select lines 216, and read/write strobes 215 between the reconfigurable memory controller 204 and all the memory blocks 212 of the memory array 202 can also be rather long. The number of signal lines in each bus, the length of routing, and the frequency of changes of a signal on the signal lines affects the amount of power consumption in the reconfigurable memory. While the length of the signal lines is somewhat fixed by the design and layout of the reconfigurable memory, the number of signal lines changing state can functionally be less in order to conserve power. That is, if charges stored on the capacitance of all the signal lines are not constantly dissipated actively to ground or if charges are not constantly added actively to the dissipated capacitance of all the signal lines, power can be conserved within an integrated circuit.

The reconfigurable memory 102 is organized into memory clusters 210 and memory blocks 212. As a result, not all bit lines within the memory blocks need to change state. Furthermore, only one address bus 217 and one data input bus 218 (write) or one data output bus 219 (read) typically needs to change state between one memory block 212 and the reconfigurable memory controller 204 at a time. All other address buses 217 and data buses 218 and 219 can remain in a stable state to conserve power. The address mappers 802A–802N generating the chip select signals 216, selectively control which input data bus and output data bus are active for one selected cluster. In this manner, power consumption can be reduced because not all bit lines of the data buses for all the clusters need to change state. Their states can be kept by the bus state keepers 812 and 902. The use of the bus state keepers can be generalized to parallel buses between the same two functional blocks, each using a multiplexer and a register to maintain a stable stored state but for the one that is predetermined to change state as indicated by an address or a control signal.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:

testing a memory in an integrated circuit to determine a location of one or more bad memory cells;

mapping out one or more address locations associated with the one or more bad memory cells;

offsetting one or more physical address locations associated with one or more good memory cells so that logical addressing is linear and the memory appears contiguous;

determining a total memory capacity of the integrated circuit, wherein the total memory capacity does not include the one or more bad memory cells; and binning out the total memory capacity of the integrated circuit.

2. The method of claim 1, wherein the memory is within an integrated circuit and the testing is self-testing performed on chip by a built in self tester.

3. The method of claim 1, wherein the memory is organized into one or more clusters, each of the one or more clusters having one or more memory blocks, and mapping out of the address location associated with the bad memory cell includes mapping out a memory block having the bad memory cell.

4. The method of claim 3, wherein offsetting one or more physical address locations associated with the one or more good memory cells is by one memory block corresponding to the size of addressable space of the memory block having the bad memory cell.

5. The method of claim 4, wherein each of the one or more good memory cells, addressable in ascending order after the memory block having the bad memory cell, has its one or more physical address locations offset by the size of addressable space in a memory block to linearize the logical addressing.

6. The method of claim 3, wherein there are four clusters each having four memory blocks and each memory block contains 512 kilobits of memory cells.

7. The method of claim 1, wherein testing the memory includes writing one or more test patterns into memory cells in the memory, reading out data from the memory cells, and comparing the read out data with an expected pattern of the one or more test patterns to determine a location of the bad memory cell.

8. The method of claim 7, wherein the location of the bad memory cell is associated with an address.

9. The method of claim 1, wherein the memory is organized into one or more clusters, each of the one or more clusters having one or more memory blocks, one or more bad memory cells are located within one or more respective memory blocks, and mapping out the address location includes mapping out the one or more respective memory blocks having the one or more bad memory cells.

10. The method of claim 9, wherein offsetting the one or more physical address locations associated with the one or more good memory cells is by the one or more memory blocks associated with the number of one or more respective memory blocks having the one or more bad memory cells and the corresponding size of addressable space of the one or more memory blocks.

11. An integrated circuit comprising:

a reconfigurable memory;

wherein the reconfigurable memory comprises:

an array of memory cells, a reconfigurable memory controller to receive a logical address and generate a physical address to address the array of memory cells, the reconfigurable memory controller to map out one or more physical addresses of words having one or more bad memory cells to form a linear logical address space without addresses to words of the one or more bad memory cells, wherein the reconfigurable memory has a total memory capacity that does not include the one or more bad memory cells and wherein the total memory capacity is binned out during testing of the reconfigurable memory.

12. The reconfigurable memory of claim 11, wherein the reconfigurable memory controller maps out one or more physical addresses of memory blocks having the one or more bad memory cells.

13. The reconfigurable memory of claim 12, wherein the reconfigurable memory controller includes a configuration register associated with each memory block, each configuration register including a memory block enable bit, the memory block enable bit to map out the respective memory blocks having the bad memory cells.

14. The reconfigurable memory of claim 13, wherein each configuration register further includes a base address associated with one or more upper address bits of an address to begin the physical addressing of a respective memory block having all good memory cells.

15. The reconfigurable memory of claim 14, wherein a value of the base address is compared with a value of the one or more upper address bits of the address to determine if each memory block having all good memory cells is selected for access.

16. The reconfigurable memory of claim 15, wherein for a given memory block the comparison between the value of the base address and the value of the one or more upper address bits of the address results in a match and the given memory block is selected for access.

17. The reconfigurable memory of claim 11, wherein each memory block is a self contained memory unit including an array of memory cells, an address decoder, sense amplifier array and tri-state data bus drivers.

18. The integrated circuit of claim 11, wherein the reconfigurable memory controller include a memory block base address.

19. The integrated circuit of claim 11, wherein the integrated circuit is an application specific integrated circuit.

20. The integraied circuit of claim 19 further comprising:

a host port.

21. The integrated circuit of claim 19 further comprising:

a memory test register; and a built-in memory self-tester.

22. The integrated circuit of claim 19 further comprising:

a memory test register;

a built-in memory self-tester; and a test access port.

23. The integrated circuit of claim 19 further comprising:

a host port;

a memory test register; and a built-in memory self-tester.

* * * * *

UNITED STATES PATENT AND TRADEMARK OFFICE

CERTIFICATE OF CORRECTION

PATENT NO. : 7,111,190 B2 
APPLICATION NO. : 10/056393
DATED : September 19, 2006
INVENTOR(S) : Venkatraman et al.

It is certified that error appears in the above-identified patent and that said Letters Patent is hereby corrected as shown below:

Column 9, at line 41, delete "prograimning" and insert --programming--.
Column 12, at line 27, delete "CL1LEN" and insert --CL1EN--.
Column 14, at line 37, delete "," and insert --; and--.

Signed and Sealed this

Twentieth Day of November, 2007

JON W. DUDAS
*Director of the United States Patent and Trademark Office*